United States Patent [19]

Aichert et al.

[11] Patent Number: 4,966,677

[45] Date of Patent: Oct. 30, 1990

[54] CATHODE SPUTTERING APPARATUS ON THE MAGNETRON PRINCIPLE WITH A HOLLOW CATHODE AND A CYLINDRICAL TARGET

[75] Inventors: Hans Aichert, Hanau am Main; Rainer Gegenwart, Rodermark; Reiner Kukla, Hanau am Main; Klaus Wilmes, Bad Orb; Jorg Kieser, Forchheim, all of Fed. Rep. of Germany

[73] Assignee: Leybold Aktiengesellschaft, Hanau am Main, Fed. Rep. of Germany

[21] Appl. No.: 344,244

[22] Filed: Apr. 27, 1989

[30] Foreign Application Priority Data

Dec. 28, 1988 [DE] Fed. Rep. of Germany ....... 3844064

[51] Int. Cl.$^5$ ...................... C23C 14/35; C23C 14/56
[52] U.S. Cl. ...................... 204/298.210; 204/298.240
[58] Field of Search ................ 204/298 ME, 298 CM, 204/298 CX, 298.21, 298.24

[56] References Cited

U.S. PATENT DOCUMENTS

| | | | |
|---|---|---|---|
| 3,725,238 | 4/1973 | Fischbein et al. | 204/298 |
| 3,855,110 | 12/1974 | Quinn et al. | 204/298 |
| 3,878,085 | 4/1975 | Corbani | 204/298 |
| 3,884,793 | 5/1975 | Penfold et al. | 204/298 |
| 4,407,713 | 10/1983 | Zega | 204/298 |

Primary Examiner—Aaron Weisstuch
Attorney, Agent, or Firm—Felfe & Lynch

[57] ABSTRACT

Cathode sputtering apparatus having a hollow cathode on the magnetron principle with a cathode base (5) in which a hollow target (9) with a cylindrical sputtering surface (10) and a cylindrical outer surface is disposed. The cathode base (5) has a cooling passage (6). The target is externally surrounded by a magnet system (18) with magnet poles for the production of a rotationally symmetrical tunnel of magnetic lines of force closed on the circumference and over the sputtering surface. Outside of the space surrounded by the sputtering surface (10) there is disposed at least one anode (3, 4). A transport path for a substrate to be coated passes through the target (9) and the at least one anode.

The cooling passage (6) is sealed off from the target (9) by a wall (7). Due to a narrow clearance, as soon as the target (9) reaches its operating temperature it comes in thermal contact with the wall (7). The [north] pole faces (N) of the magnet system (18) are on one side and the other [south] pole faces (S) lie on the other side of the end faces of the target (9) and radially on a radius which is equal to or greater than the radius of the sputtering surface (10). The magnet system (18) is held at a freely adjustable ("floating") potential in operation by insulating spaces (11, 19, 10).

17 Claims, 5 Drawing Sheets

CATHODE SPUTTERING APPARATUS ON THE MAGNETRON PRINCIPLE WITH A HOLLOW CATHODE AND A CYLINDRICAL TARGET

BACKGROUND OF THE INVENTION

The invention relates to a cathode sputtering apparatus having (a) a hollow cathode on the magnetron principle with a cathode base having at least one cooling passage and an inner cylindrical surface for receiving a hollow target having an inner, likewise substantially cylindrical sputtering surface and a cylindrical outside surface. A magnet system externally surrounds the cathode base, with magnet poles for the production of a rotationally symmetrical tunnel of magnetic lines of force closed on the circumference and over the sputtering surface.

(b) at least one anode substantially coaxial with the sputtering surface lies outside of the space surrounded by the sputtering surface.

(c) with a path for the transport of a substrate to be coated runs through the at least one anode.

DE-OS No. 22 43 708 has disclosed such cathode sputtering apparatus in which the plasma produced in operation is confined on six sides, four sides of which are formed by the target and the magnetic lines of force and the two remaining sides are formed by the annular closing of the magnetic tunnel. Magnetron cathodes obey the formula $E \times B$, E defining the electrical field and B the magnetic field. The sputtering rate is highest where the lines of force of E and B intersect at right angles and the magnetic lines of force run parallel to the target surface.

In some of the embodiments of hollow magnetrons according to DE-OS No. 22 43 708, largely axis-parallel sections of the magnetic lines of force are used in the area of the sputtering surfaces. Since here the condition $E \times B$ is optimally fulfilled just about everywhere, the target material is eroded very uniformly. The very high material efficiency that is thus possible, however, is achieved at the cost of the considerable disadvantage that, in order to satisfy the quadrilateral condition, the target has to have flanges made of target material that face radially inward. This makes the target expensive and it is subject to an uneven thermal expansion with additional heat input, because the flanges act to some extent as "heat ribs."

In other embodiments of hollow magnetrons pursuant to DE-OS No. 22 43 708, the quadrilateral condition is satisfied by the fact that the magnetic lines of force are severely curved, issue from the cylindrical or conical sputtering surfaces at one point, and after passing through arcuate paths return at a different point. Thus the condition $E \times B$ is optimally fulfilled only in the area of circular lines which pass through the culmination points of the magnetic lines of force situated above the sputtering surface, because only in the vicinity of the culmination points do the magnetic lines of force run at least approximately parallel to the target surface. This does permit the production of targets that are geometrically simple since they are hollow-cylindrical, but it has the considerable disadvantage that the material ablation takes place predominantly under the above-mentioned culmination points or lines, so that deep erosion pits are formed in the target on its inner circumference, leading very soon to the failure of the target and thus to a poor material efficiency. The local heat input corresponds to the local sputtering rate, so that the linearly eroded hollow cylindrical targets are subject to a slight barrel-shaped distortion, but one which nevertheless interferes with the heat transfer between the transfer surfaces.

In both cases, therefore, poor target cooling conditions are involved, so that it has been necessary to resort to exposing the target at its outside surface directly to the coolant (water). This, however, leads to sealing problems between the cathode base and the target, and it is to be noted that cathode sputtering processes are performed with vacuums between about $10^{-2}$ and $10^{-4}$ mbar, so that even minimal leakage leads to a collapse of the vacuum and/or to contamination of the products. Changing the target thus becomes extraordinarily difficult and time-consuming.

SUMMARY OF THE INVENTION

The invention is addressed to the problem of devising a cathode sputtering apparatus of the kind described above, in which the target can be sputtered with a high material efficiency at high sputtering rates and intensive cooling without direct contact with a coolant, and in which the target can be made from simple and inexpensive pipe sections without great need for machining.

The problem described above is solved in the above-described cathode sputtering apparatus, wherein:

(d) The at least one cooling passage is sealed off from the target by a wall of cylindrical inner surface which is part of the cathode base.

(e) The tubular target is inserted axially into the cylindrical inner surface of the wall with such tight clearance that it comes into thermal contact with the wall as soon as it reaches its working temperature.

(f) The magnet system consists of a rotationally symmetrical magnet yoke concentric with the target and studded with permanent magnets pointing radially inward, and has pole faces of opposite polarity (N, S) in a continuous ring. The pole faces (N) lie, in the axial direction, inside of the end faces of the target, and the other pole faces (S) lie beyond the end faces of the target, on a radius which is equal to or greater than the radius of the sputtering surface.

(g) The magnet system can be kept in a known manner at a freely adjustable ("floating") potential with respect to the target and cathode base on the one hand and the anode potential on the other.

Feature (d) brings it about that the target can be replaced without opening the cooling passage or cooling circuit.

Feature (e) first describes a tubular target without radial projections, so that it can be made very simply from tubular material. The tight clearance and the unavoidable thermal stress on the target causes the target to become intensively cooled after a start-up period, without direct contact with a coolant such as water. This cooling effect can be enhanced by making the hollow cylindrical wall that closes off the interior of the cooling passage very thin, in the manner of a diaphragm, so that it is made to bulge slightly by the water pressure and thus is pressed against the target. It is thus possible to give the onset of thermal equilibrium a controlled shift toward lower temperatures. In practice, a wall thickness between 1 and 2.5 mm has proven to be especially desirable.

Feature (f) brings it about that the portion of the magnetic lines of force that run within the target surface in the cylindrical volume is only slightly curved, so that the target is eroded very uniformly over its entire cylindrical surface. To state it more precisely, these are the sections of the magnetic lines of force which run between the two planes in which the annular faces of the target are situated. Thus, in the case of a tubular target, a material efficiency or degree of utilization is achieved in the case of tubular targets which otherwise could not be achieved. Furthermore, because of the fact that, in the reactive sputtering of insulating coatings on the entire target surface that is at potential, a net erosion takes place, so that no non-conducting areas result from self-coating of the cathode.

Simply stated, feature (f) means that the distance between the magnet poles and pole faces of opposite polarity is greater than the axial length of the cathode base and target, respectively. For this reason alone the radius of curvature of the magnetic lines of force is longer. Furthermore, this method of construction makes it possible for the pole faces to be disposed further inward radially, thereby further intensifying this effect.

Feature (g) permits the magnet system and the housing parts and shielding to be set at a floating potential at which no sputtering of these exposed parts will take place.

On the whole, the tubular cathode in accordance with the invention has also the following additional advantages:

virtually all of the atoms sputtered from the target are deposited onto the substrate, substrates in rod, tube or wire form can be coated on all sides without substrates rotation, the concentration of the sputtered particles from a large target diameter on the necessarily smaller substrate diameter results in a high coating rate, a simple mounting of the target is possible, without solder, adhesives or screws.

It is especially advantageous if two anodes are provided with cylindrical inner surfaces in a mirror-image symmetry with the cathode, the one anode of which is axially at one end of the cathode and the other anode is axially at the other end of the cathode, while the cylindrical inner surfaces of the anodes have a radius which is equal to or shorter than the radius of the sputtering surface of the target. In this manner a good coupling of the anodes into the circuit is made possible.

For the maintenance or adjustment of a particular gas atmosphere within the sputtering apparatus it is especially advantageous if the anodes each bear on the sides facing the cathode an annular gas distributing conduit which is provided with corresponding gas exhaust openings.

With a cathode sputtering apparatus of this kind it is also possible to produced mixed coatings and coatings of a quasi-alloy, that is, when the target is composed of different substances in the axial direction.

The cathode sputtering apparatus in accordance with the invention can be further developed by making it suitable for sputtering targets of ferromagnetic materials.

This is accomplished in an especially advantageous manner by dividing the target consisting of ferromagnetic material into three hollow cylindrical target parts, two of which situated on the outside in the axial direction overlap axially with the target part that is in the middle, but enclose in the radial direction, at the overlaps, an air gap with respect to the target part lying in the center, whose radial width "s" is smaller than the dark-space distance that is established under the operating conditions.

This forces the lines of force to emerge from ferromagnetic parts of the target, a process which will be further explained in connection with FIG. 4.

DETAILED DESCRIPTION OF THE PREFERRED EMBODIMENT

Figure 1:
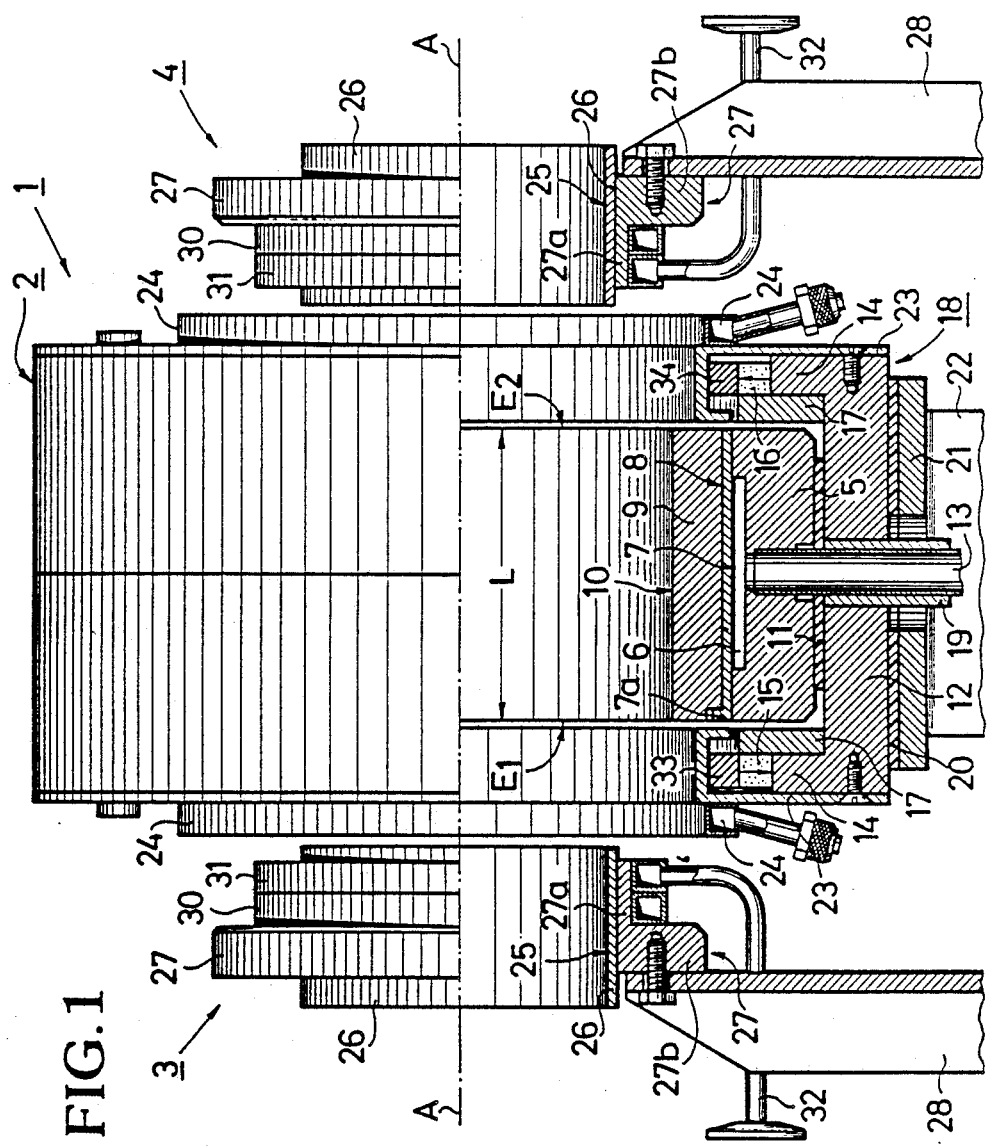
FIG. 1 is a side elevation (top) and an axial section (bottom) through a magnetron tubular cathode having a target of a nonferromagnetic material.

In FIG. 1 there is shown a cathode sputtering apparatus 1 based on the hollow magnetron principle, which consists of a cathode part 2 and two anode parts 3 and 4. Both the cathode part and the anode parts are configured in substantially rotational symmetry with a system axis A—A.

In the bottom part of FIG. 1 there is shown an annular cathode base 5 which is provided with a circumferential, annular cooling passage 6. On the side toward the system axis A—A the cooling passage 6 is sealed off by a diaphragm-like wall 7 with a cylindrical inside surface 8 into which a tubular target 9 with a cylindrical sputtering surface 10 and a likewise cylindrical outside surface is inserted. As it can be seen, the target 9 is in the form of a thick-walled tube, i.e., it has a relatively very long useful life. At one end of the wall 7 is a radially inwardly turned abutment 7a for the target 9.

The cathode base 5 is surrounded, with the interposition of an insulating ring 11, by a annular magnet yoke 12 which has a C-shaped cross section as seen in axial section. Two coolant conduits 13 are brought through the magnet yoke 12, the insulating ring 11 and the cathode base 5, and lead into the cooling passage 6. In the area of the magnet yoke 12 the conduits 13 are surrounded by an insulating sleeve 19.

The magnet yoke 12 has two flanges 14 projecting radially inwardly, on which a continuous annular crown of permanent magnets 15 and 16 of opposite polarity is placed. It can be seen that the clearance between the permanent magnets 15 and 16 is decidedly greater than the length dimension L between two radial planes $E_1$ and $E_2$, in which the annular end surfaces of cathode base 5 and target 9 are situated.

The interstices between the permanent magnets 15 and 16 and the cathode base 5 are mostly filled up by aluminum rings 17 leaving annular gaps, not further identified, on both sides of the cathode base 5, these gaps being kept so narrow that no glow discharge can form in them.

Magnet yoke 12 and permanent magnets 15 form a magnet system 18 which is held away from the cathode base 5 by insulating separations, namely by air gaps, the insulating ring 11 and the insulating sleeve 19. The magnet yoke 12 simultaneously forms a load-bearing portion of the entire system and rests through an additional insulator 20 on the sector-shaped flange 21 of a support. By this mounting which is insulated on all sides the magnet system 18 can be freely adjusted (float freely) as regards its voltage, not only with respect to the cathode body but also to the support 22 which is at ground potential.

The radial end faces of the magnet yoke 12 and the lateral outer surfaces of the permanent magnets 15 and 16, as well as the radially inwardly directed pole faces of the permanent magnets are covered each by a magnet shield 23 consisting of a nonferromagnetic material which is conductively connected electrically with the other parts of the magnet system. The annular magnet shields 23 have an L-shaped cross section whose longer limb is aligned radially and whose shorter limb is aligned axially. The magnetic shields 23 are also equipped each with an annular cooling passage 24 which is provided with inlet and outlet lines 40 (see also FIG. 4).

In FIG. 1 it can also be seen that the two anode parts 3 and 4 are provided with cylindrical inner surfaces 25, the system 1 being arranged with insulating separations and in mirror-image symmetry with the cathode-2. Thus the one anode 3 is disposed on one side in the axial direction and the other anode 4 on the other side of the cathode in the axial direction. The cylindrical inner surfaces 25 of the anodes have a radius which is shorter than the radius of the sputtering surface 10 of the target 9. The cylindrical inner surfaces 25 are formed by cylindrical tube sections 26 which are inserted into the axis-parallel limbs 27a of an L-shaped annular flange 27 whose limb 27b directed radially outward is joined at the bottom to a support 28. The support 28 can rest on and be conductively connected to an inner surface of a vacuum chamber 29 and thus can be at ground potential.

Figure 5:
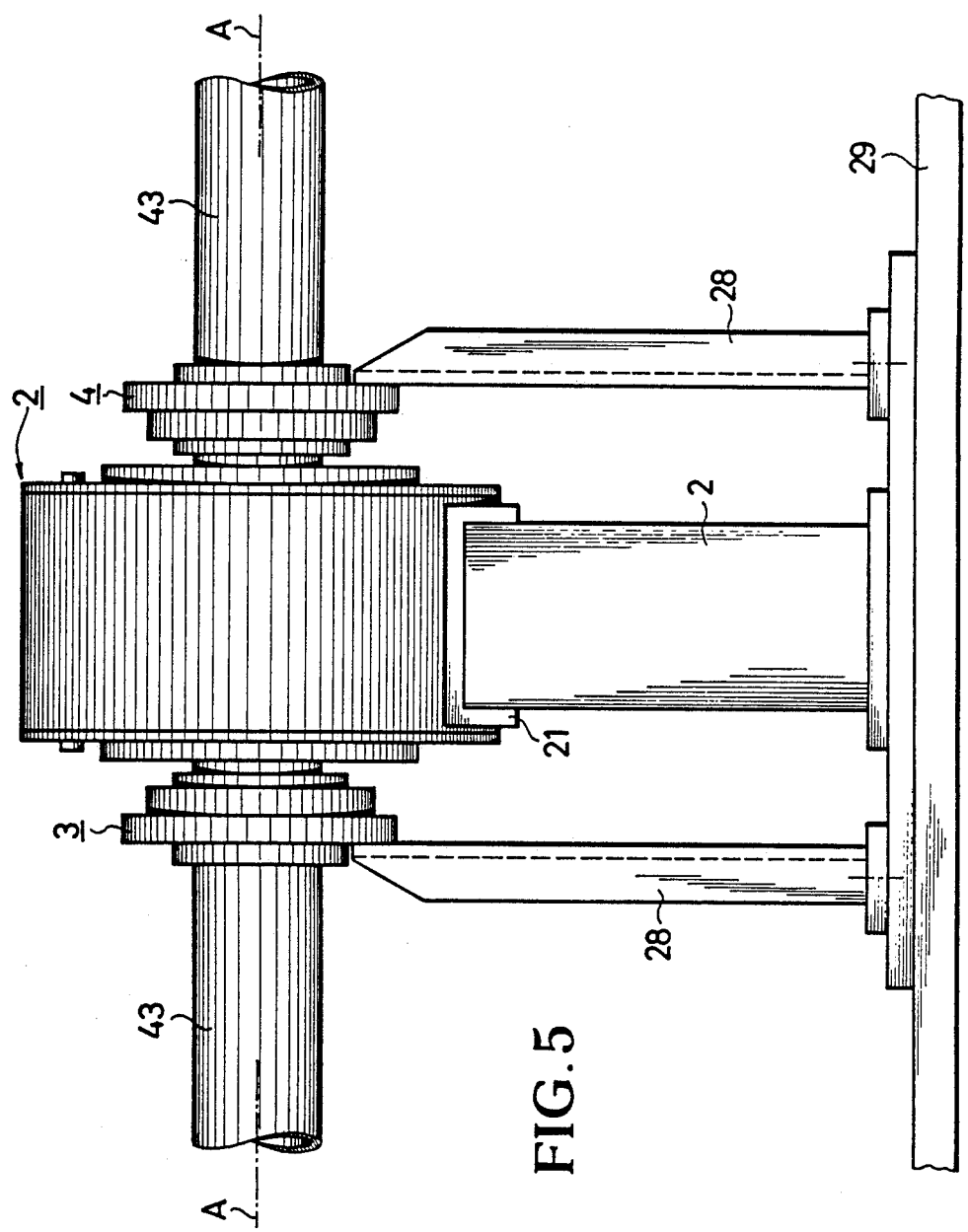
FIG. 5 is a side elevation of a complete cathode-anode system of a cathode sputtering apparatus similar to FIGS. 1 or 3.

It is also possible, however, to fasten the supports in an insulated manner on the vacuum chamber, so that the anode parts 3 and 4 can be connected to a potential that is positive with respect to ground, thereby intensifying the anode function (FIG. 5). The anode parts 3 and 4 are also provided each with an annular cooling passage. On the sides facing the cathode 2 they each have an annular gas passage 30. On the sides facing the cathode 2 they each have also an annular gas distributing conduit 31 which is provided with perforation-like gas emission bores aimed at the cathode 2, which are not represented. The gas distribution conduits 31 are connected by connecting lines 32 to sources, not shown, of a sputtering gas which can also contain a reactive component.

It is also shown in FIG. 1 that pole shoes 33 and 34 of soft magnetic material are placed on the axis-parallel surfaces of permanent magnets 15 and 16 facing radially inwardly away from the magnet yoke 12. In this case the N and S pole faces are no longer formed by the radially inward facing surfaces of the permanent magnets 15 and 16 but by the inner surfaces of the pole shoes, namely both by the axis-parallel and by the inwardly lying radial surface portions of the pole shoes. The entire arrangement is here again in full ring form, and it is to be understood that the two L-shaped magnet shields 23, as seen radially inwardly, also overreach and overlap the pole shoes 33 and 34.

Figure 2:
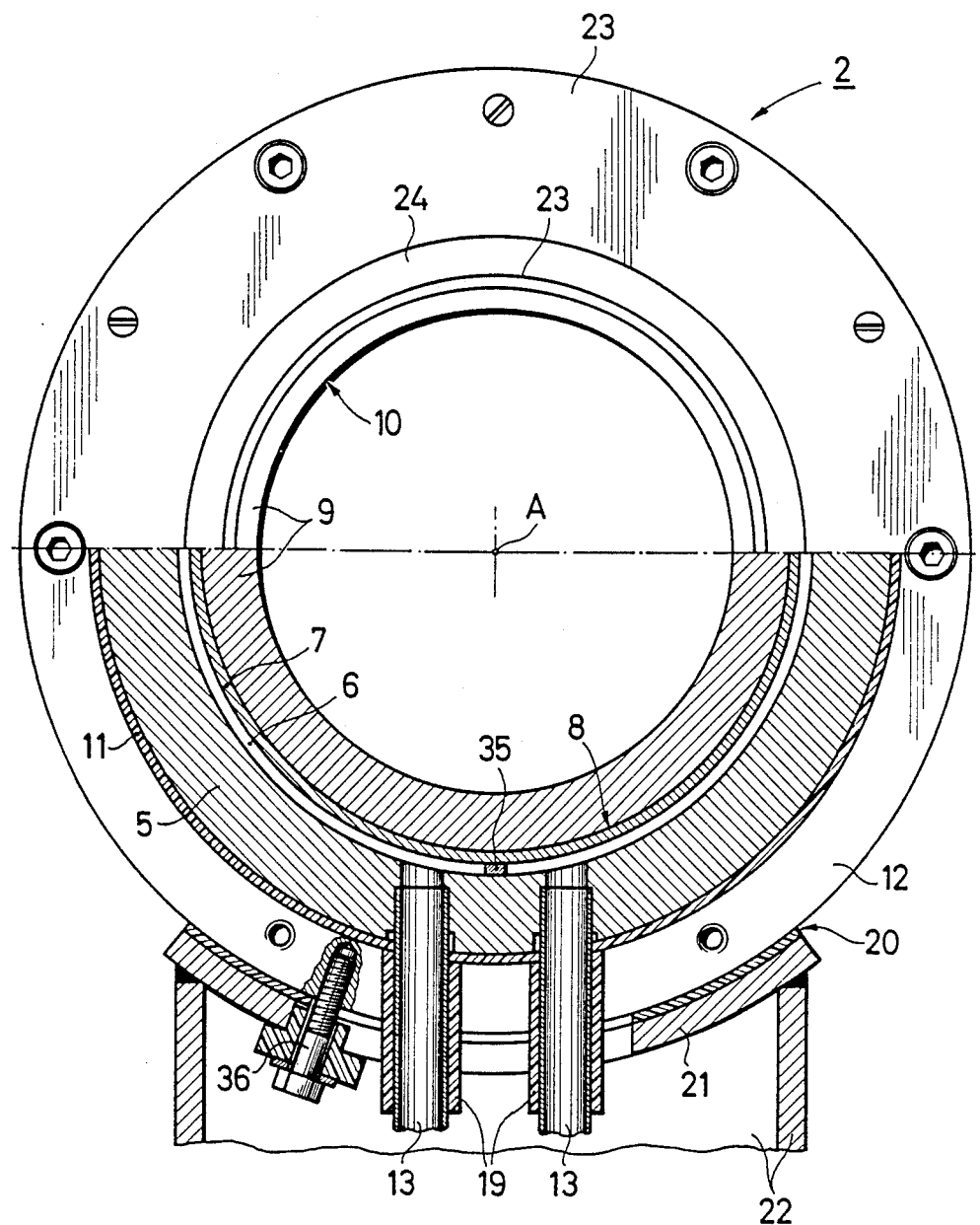
FIG. 2 is an end view (top) and a radial section (bottom) through the subject of FIG. 1, on a slightly enlarged scale.

In the case of FIG. 2, the anode part that otherwise partially blocks the view, has been omitted. It can also be seen that the cooling passage 6 between the two coolant lines 13 is interrupted by a barrier 35 to prevent a short-circuit of the flow. Otherwise the reference numbers are the same as in FIG. 1. The screw 36 indicates that the support 22 with flange 21 and magnet yoke 12 form the means for the support of the rest of the structure of the cathode.

It is quite important that the tubular target 9 is able to be withdrawn rightwardly out of the cathode after the release of the magnet shield 23 on the right in FIG. 1 and the removal of the annularly disposed pole shoes 34, by sliding it axially away from the wall 7 which remains in place. The installation of a new target 9 is performed in the reverse order: the new target is simply slipped in until it abuts against the shoulder 7a. The target has a complementary chamfer to accommodate the abutment shoulder 7a.

Figure 3:
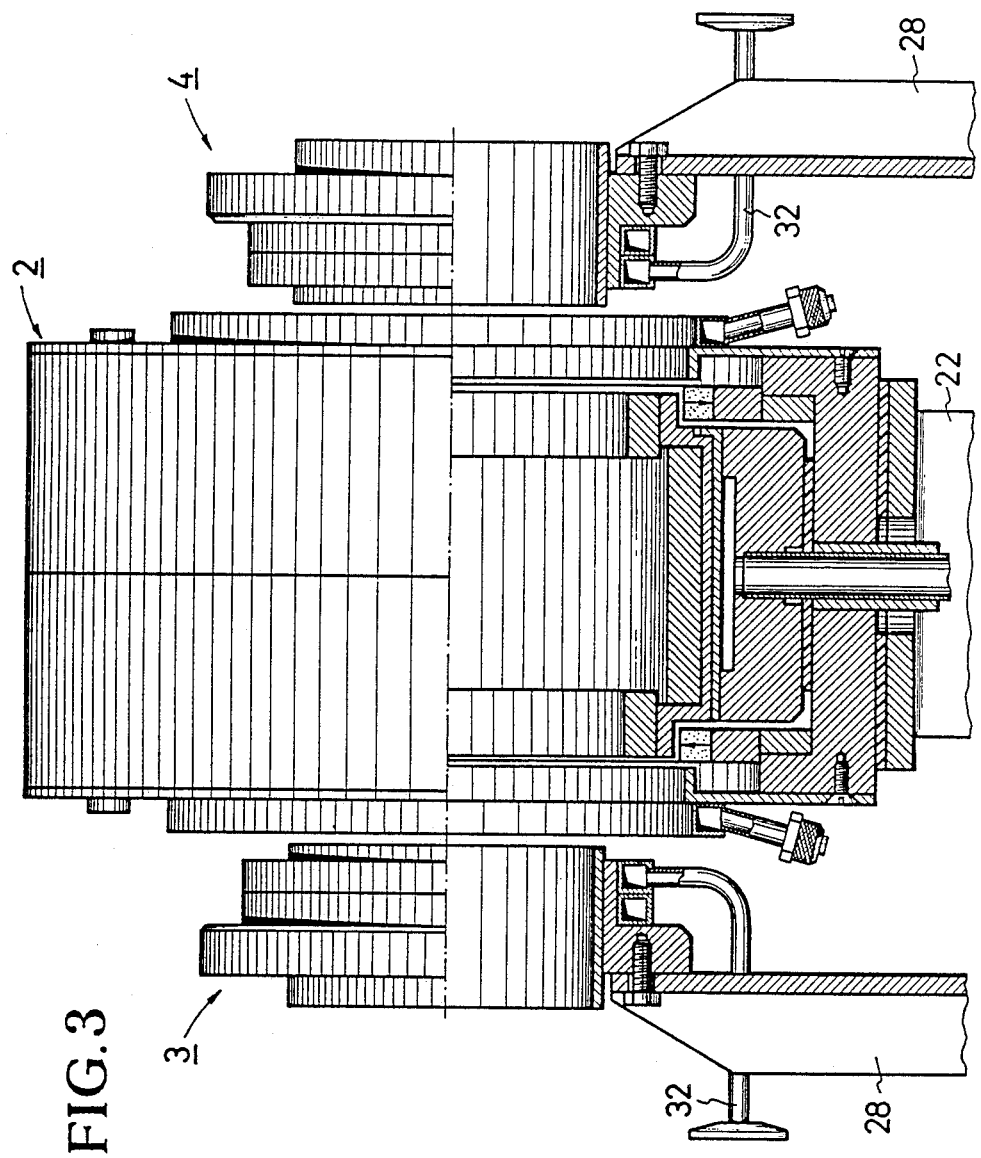
FIG. 3 is a side view and an axial section through a magnetron tubular cathode with target parts of a ferromagnetic material similar in representation to FIG. 1.

FIG. 3 shows a system which is very largely the same as the system in FIGS. 1 and 2. The essential difference is explained with the aid of FIG. 4, which shows an enlarged detail of the bottom central part of FIG. 3. Equal parts are here again identified by the same reference numbers.

The target 9 consists of ferromagnetic material and is divided into three hollow cylindrical target parts 9a, 9b and 9c. The two target parts 9a and 9c that are on the outside in the axial direction overlap target part 9b which lies in the middle, and in the overlapping area they enclose each a radial air gap 37 and 38, respectively, between them and the target part 9b lying in the middle. The radial width of this air gap is in every case smaller than the dark-space gap that establishes itself under the operating conditions, so that the glow discharge that burns during operation is unable to penetrate into the air gaps 37 and 38.

The spatial arrangement of the system is fixed by the fact that the target parts 9a, 9b and 9c are disposed, while preserving their overlap and air gaps, on a target holder which is configured as a bipartite body of rotation, consists of nonmagnetic material, and has good electrical and thermal conductivity (copper). The target parts 9a, 9b and 9c form a single structural unit with this target holder 39 and can be removed leftward with the latter from the wall 7 (refers to FIG. 4).

Figure 4:
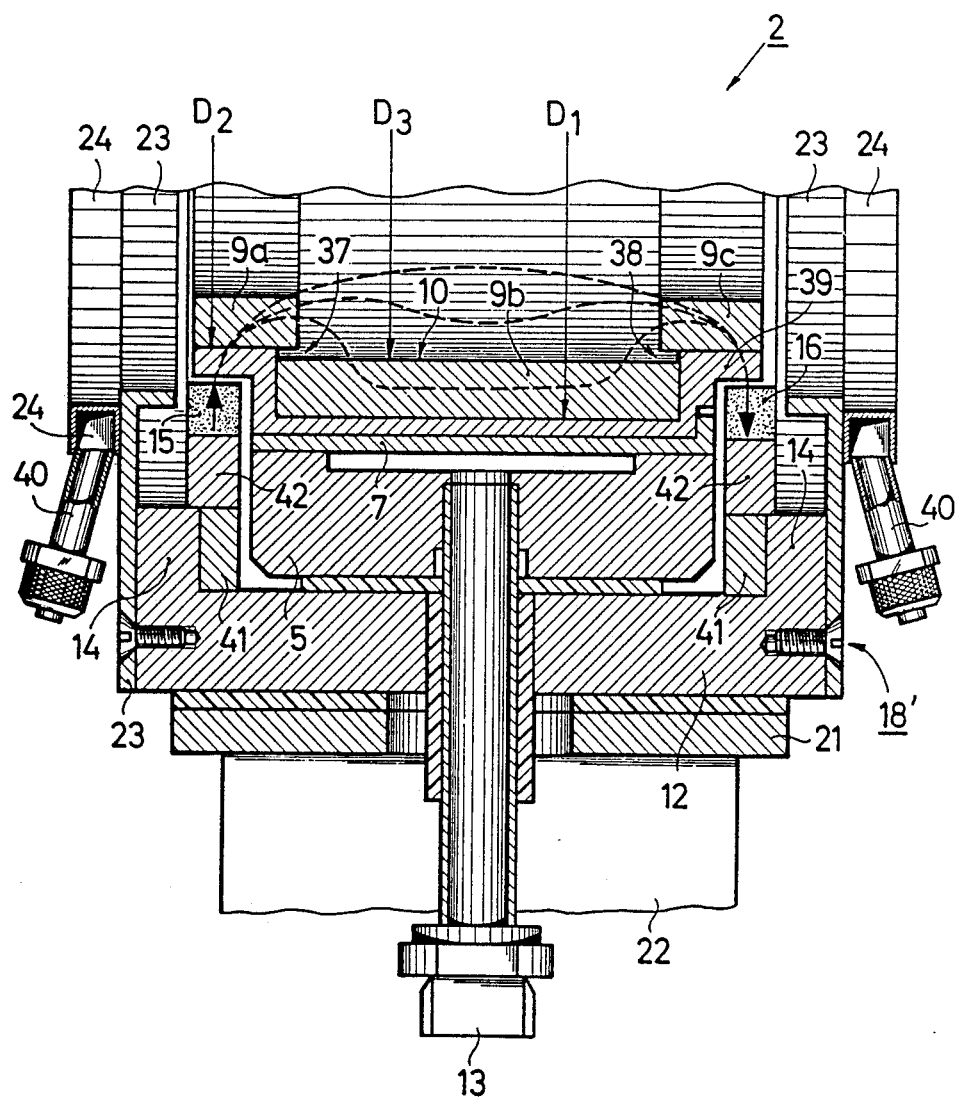
FIG. 4 is a detail from the bottom half of FIG. 3 on a larger scale.

The target holder 39, as represented in FIG. 4, is configured in a zig-zag shape in an axial section with respect to a radial plane of symmetry in which the axis of the coolant line 13 is also located. Thus a central, hollow cylindrical section is formed with a first inside diameter $D_1$ which is joined by two annular radial limbs with two hollow cylindrical sections situated on the outside axially, which have a second inside diameter $D_2$. The absolute measure of the diameter difference $D_2 - D_1$ corresponds to twice the wall thickness of the middle target part 9b plus twice the radial width of each of the two air gaps 37 and 38. On the other hand, the inside diameter $D_2$ of the outside target parts 9a and 9c is smaller by twice the radial dimension of each air gap 37 and 38, respectively, than the inside diameter $D_3$ of the middle target part.

In an especially desirable manner, the target holder 39, as seen axially, is divided in the center, such that the two support parts, which are not here separately distinguished, can be placed in the direction of the axis onto the central target part 9b.

In FIG. 4 it is also shown how the two coolant passages 24 are provided with connecting lines 40.

With regard to the magnet system 18' here shown and its magnetic properties which result from the special arrangement of the ferromagnetic target parts 9a, 9b and 9c, the following is also pointed out. Due to the interposition of the air gaps the shape of the lines of force is as indicated in broken lines in FIG. 4. In this case the flange 14 of the magnet yoke 12 is reinforced axially and radially inwardly by rings 41 and 42 of soft magnetic material, the permanent magnets 15 and 16 being placed radially inwardly onto the rings 42 with corresponding polarity (see arrows in the drawing). The permanent magnets 15 and 16 can thus be brought closer to the middle target part 9b and made to overlap target parts 9a and 9c.

The magnetic field in any case partially spans the two air gaps 37 and 38, but part of it also runs directly from target part 9a to target part 9c. The lowermost indicated line of force would alone lead to two annularly closed "plasma tubes" outside of the air gaps 37 and 38. In conjunction with the lines of force forming a kind of bridge between target parts 9a and 9c, however, a much larger annular plasma tube is formed also in the middle area of the target part 9b, resulting in a virtually full-surface ablation (erosion) of the middle target part 9b.

Due to the geometrical shape of the target holder 39 and to the amount of the overlap in the area of the air gaps 37 and 38, and on account of the ratios of the diameters $D_1$, $D_2$ and $D_3$, it is possible to vary the ratio of the lines of force flowing through the middle target part 9b to the lines of force spanning the middle target part like a bridge. By careful tuning, it is possible to optimize the erosion effect in the area of the sputtering surface 10 to very uniform values over virtually the entire length of the middle target part 9b.

From the above description it will be seen that the middle target part 9b is the actual target, while the two outer target parts 9a and 9c can also be considered to be pole shoes. The axial position of pole faces and target, defined in feature (f) of the principal claim, refers to the pole faces of the permanent magnets 15 and 16 and the middle target part 9b.

The substrates that are to be coated, in the form of wires, rods or (thin) tubes are moved through the cathode sputtering apparatus coaxially with the system axis A—A. The system axis A—A thus defines the path on which the substrates are transported. Special substrate holders or guides (e.g., roller systems) have not been represented for the sake of simplicity.

It is also shown in FIG. 5 that the path of the transport of the substrates is surrounded by tubular shields 43 which are fastened to the anode parts 3 and 4 and are at the same potential therewith.

The term "air gaps" in conjunction with the spaces 37 and 38 does not necessarily mean that they are hollow spaces. The distances in question can also be filled with a nonferromagnetic material.

It should also be mentioned that the magnet yoke consists of two halves abutting one another at a radial seam to permit the insertion of the cathode base. This is not, however, particularly indicated in the drawings.

We claim:
1. Cathode sputtering apparatus having
   (a) a hollow cathode on the magnetron principle with a cathode base having axially opposed end faces, at least one cooling passage and an inner cylindrical surface for receiving a hollow target with axially opposed end faces, an inner, likewise substantially cylindrical sputtering surface and a cylindrical outer surface, with a magnet system having magnet poles for the production of a rotationally symmetrical tunnel of magnetic lines of force closed on the circumference and over the sputtering surface,
   (b) at least one anode substantially coaxial with the sputtering surface and lying axially outside of the space surrounded by the sputtering surface of the target, and
   (c) having a transport path for a substrate to be coated running coaxially through the target and the at least one anode, characterized by the fact that
   (d) the at least one cooling passage (6) is sealed off in the direction of the target (9) by a wall (7) of cylindrical inside surface (8) belonging to the cathode base (5),
   (e) the tubular target (9) is inserted axially into the cylindrical inner surface (8) of the wall (7) with such tight clearance that the target (9) makes thermal contact with the wall no later than upon reaching its working temperature,
   (f) the magnet system (18) comprises a rotationally symmetrical magnet yoke (12) concentric with the target (9) and radially inwardly pointing permanent magnets (15, 16), and annularly closed pole faces of opposite polarity (N, S) of which the north pole faces (N) are axially spaced from one end of the target (9) and the other pole faces (S) are axially spaced from the other end of the target and in the radial direction lie on a radius which is equal to or greater than the radius of the sputtering surface (10), and that
   (g) the magnet system (18) is held by insulating spaces (11, 19, 20) at a freely adjustable potential in relation to the target (9) and the cathode base (5) on the one hand and the anode potential on the other.

2. Cathode sputtering apparatus in accordance with claim 1, characterized in that the end faces of cathode base (5) and target (9) lie pair-wise in common radial planes ($E_1$, $E_2$).

3. Cathode sputtering apparatus in accordance with claim 1, characterized in that the wall (7) defining the cooling passage (6) is provided with a radially inwardly directed shoulder (7a) for abutment by the target (9).

4. Cathode sputtering apparatus in accordance with claim 1, characterized in that on the radially inwardly directed axis-parallel surfaces of the permanent magnets (15, 16) facing away from the magnet yoke (12) pole shoes (33, 34) of soft magnetic material are placed which bear the annularly closed pole faces (N, S).

5. Cathode sputtering apparatus in accordance with claim 1, characterized in that the axial end faces of the magnet yoke (12) and the radially inwardly directed pole faces of the permanent magnets (15, 16) are covered each by an annular magnet shielding (23) consisting of a nonferromagnetic material, which is electric-conductively connected to the rest of the parts of the magnet system (18).

6. Cathode sputtering apparatus in accordance with claim 5, characterized in that the annular magnet shields (23) have an L-shaped cross section whose long limb is aligned radially and whose short limb is aligned axially.

7. Cathode sputtering apparatus in accordance with claim 5, characterized in that the magnet shields (23) have each an annular cooling passage (24).

8. Cathode sputtering apparatus in accordance with claim 1, characterized in that two anode parts (3, 4) with cylindrical inner surfaces (25) are provided in mirror-image symmetry with the cathode (2), the one anode (3) of which lies on one side in the axial direction and the other anode (4) on the far side of the cathode (2), the cylindrical inner surfaces (25) of the anodes having a radius which is equal to or smaller than the radius of the sputtering surface (10) of the target (9).

9. Cathode sputtering apparatus in accordance with claim 8, characterized in that the anode parts (3, 4) have cylindrical tubular sections (26) which are inserted into the axis-parallel limbs (27a) of an L-shaped flange (27) whose radially outwardly directed limb (27b) is connected to a support (28).

10. Cathode sputtering apparatus in accordance with claim 9, characterized in that the anode parts (3, 4) have each an annular cooling passage (30).

11. Cathode sputtering apparatus in accordance with claim 8, characterized in that the anode parts (3, 4) bear on the sides facing the cathode (2) one annular gas distribution conduit (31) each.

12. Cathode sputtering apparatus in accordance with claim 1, characterized in that the target (9) is composed in the axial direction of different materials.

13. Cathode sputtering apparatus in accordance with claim 1, characterized in that the target (9b) consists of ferromagnetic material, the apparatus further comprising two hollow cylindrical outer target parts (9a, 9c) of ferromagnetic material which overlap in the axial direction with the target (9b) lying in the center and which in the radial direction are spaced inward from respective permanent magnets and enclose each an air gap (37, 38) in the overlapping areas with respect to the target (9b) lying in the center, whose radial width is smaller than the dark space distance that establishes itself under the operating conditions.

14. Cathode sputtering apparatus in accordance with claim 13, characterized in that the target (9b) and the outer target parts (9a, 9c) are fastened, preserving overlap and air gaps, on a target holder (39) of nonmagnetic material in the form of a body of rotation which has a good electrical and thermal conductivity.

15. Cathode sputtering apparatus in accordance with claim 14, characterized in that the target holder (39) is configured in a double Z shape in an axial section with respect to a radial plane of symmetry, such that a middle, hollow cylindrical section with a first outside diameter $D_1$ is connected by two circular radial portions to two hollow cylindrical sections with two axially outwardly lying hollow cylindrical sections with a second outside diameter $D_2$ while the absolute dimension of the diameter difference $D_2-D_1$ corresponds to twice the wall thickness of the central target portion (9b) plus twice the radial width of the air gap (37, 38).

16. Cathode sputtering apparatus in accordance with claim 15, characterized in that the target holder (39), as seen axially, is divided in the center such that the two parts of the support can be slipped axially onto the middle target part (9b).

17. Cathode sputtering apparatus in accordance with claim 13, characterized in that the outside diameter $D_2$ of the target parts (9a, 9c) situated axially outside is smaller by the radial dimension than the inside diameter $D_3$ of the target (9b).

* * * * *